(12) United States Patent
Pinarbasi

(10) Patent No.: US 6,826,021 B2
(45) Date of Patent: Nov. 30, 2004

(54) SPIN VALVE SENSOR HAVING ULTRA-THIN FREELAYERS INCLUDING NICKEL-IRON, RUTHENIUM, AND A COBALT-IRON NANOLAYER

(75) Inventor: Mustafa Pinarbasi, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 116 days.

(21) Appl. No.: 10/115,467

(22) Filed: Apr. 3, 2002

(65) Prior Publication Data

US 2003/0189800 A1 Oct. 9, 2003

(51) Int. Cl.[7] .............................................. G11B 5/39
(52) U.S. Cl. .............................................. 360/324.12
(58) Field of Search ........................... 360/324.12, 314

(56) References Cited

U.S. PATENT DOCUMENTS

| | | | | |
|---|---|---|---|---|
| 4,477,794 A | * | 10/1984 | Nomura et al. ............. | 360/327 |
| 4,622,613 A | * | 11/1986 | Nomura et al. ............. | 360/322 |
| 5,408,377 A | * | 4/1995 | Gurney et al. .......... | 360/324.12 |
| 5,850,323 A | * | 12/1998 | Kanai .................... | 360/324.11 |
| 5,891,586 A | * | 4/1999 | Hasegawa et al. .......... | 428/928 |
| 5,896,252 A | * | 4/1999 | Kanai .................... | 360/324.12 |
| 5,920,446 A | | 7/1999 | Gill | |
| 6,317,299 B1 | | 11/2001 | Pinarbasi | |
| 6,424,506 B1 | * | 7/2002 | Saito et al. ............. | 360/324.11 |
| 6,473,278 B1 | * | 10/2002 | Gill ...................... | 360/324.12 |
| 6,538,858 B1 | * | 3/2003 | Hasegawa et al. ..... | 360/324.12 |
| 6,630,248 B1 | * | 10/2003 | Horng et al. .......... | 360/324.12 |
| 2001/0040781 A1 | * | 11/2001 | Tanaka et al. ......... | 360/324.12 |

OTHER PUBLICATIONS

N. Hasegawa, M. Saito, K. Tanaka, Y. Ide, F. Koike, Y. Nakazawa, and T. Kuriyama, Spin–Valve GMR Heads with Synthetic Ferrimagnet Free and Pinned Layers, Journal of the Magnetics Society of Japan, Nov. 9, 2000, pp. 1239–1245, vol. 24, No. 9, Japan.

Subrata Dey, Spin Valve AMR, and Hall Effect, Journal of Applied Physics, May 1, 2000, pp. 6974–6976, vol. 87, No. 9, American Institute of Physics.

* cited by examiner

Primary Examiner—Craig A. Renner
(74) Attorney, Agent, or Firm—John J. Oskorep, Esq.

(57) ABSTRACT

A spin valve (SV) sensor has a cap layer made of tantalum; a copper layer formed beneath the cap layer; and a unique freelayer structure. The freelayer structure includes a first layer made of nickel-iron, a second layer made of ruthenium, a third layer made of nickel-iron, a nanolayer made of cobalt-iron, and a spacer layer made of copper adjacent the nanolayer of cobalt-iron. The first layer of nickel-iron is no greater than each one of the third layer of nickel-iron and the nanolayer of cobalt-iron. The nanolayer has a thickness of no more than 30 Angstroms. The net freelayer thickness, determined based on subtracting a thickness of the first layer of nickel-iron from a sum of thicknesses of the third layer of nickel-iron and the nanolayer of cobalt-iron, is less than 50 Angstroms. Advantageously, this thin structure provides a high magnetoresistive coefficient and soft magnetic properties.

13 Claims, 6 Drawing Sheets

SPIN VALVE SENSOR HAVING ULTRA-THIN FREELAYERS INCLUDING NICKEL-IRON, RUTHENIUM, AND A COBALT-IRON NANOLAYER

BACKGROUND OF THE INVENTION

1. Field of the Invention

This invention relates generally to magnetic heads, and more particular to antiparallel (AP) pinned type spin valve (SV) sensors having ultra-thin freelayers.

2. Description of the Related Art

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive read sensors, commonly referred to as MR heads, are the prevailing read sensors because of their capability to read data from a surface of a disk at greater linear densities than thin film inductive heads. An re MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flow through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

GMR sensors using only two layers of ferromagnetic material (e.g., Ni—Fe) separated by a layer of non-magnetic material (e.g., Cu) are generally referred to as spin valve (SV) sensors manifesting the GMR effect (also referred to as the SV effect). In an SV sensor, one of the ferromagnetic layers, referred to as the pinned layer, has its magnetization typically pinned by exchange coupling with an antiferromagnetic (e.g., NiO or Fe—Mn) layer. The magnetization of the other ferromagnetic layer, referred to as the freelayer, however, is not fixed and is free to rotate in response to the field from the recorded magnetic medium (the signal field). In the SV sensor, the SV effect varies as the cosine of the angle between the magnetization of the pinned layer and the magnetization of the freelayer. Recorded data can be read from a magnetic medium because the external magnetic field from the recorded magnetic medium (the signal field) causes a change in direction of magnetization in the freelayer, which in turn causes a change in resistance of the SV sensor and a corresponding change in the sensed current or voltage. IBM's U.S. Pat. No. 5,206,590 granted to Dieny et al. and incorporated herein by reference, discloses an MR sensor operating on the basis of the SV effect.

FIG. 1 shows a prior art SV sensor 100 comprising end regions 104 and 106 separated from each other by a central region 102. A freelayer (free ferromagnetic layer) 110 is separated from a pinned layer (pinned ferromagnetic layer) 120 by a non-magnetic, electrically-conducting spacer 115. The magnetization of the pinned layer 120 is fixed by an antiferromagnetic (AFM) layer 125. Freelayer 110, spacer 115, pinned layer 120 and the AFM layer 125 are all formed in the central region 102 over a substrate 128. Hard bias layers 130 and 135 formed in the end regions 104 and 106, respectively, provide longitudinal bias for the freelayer 110. Leads 140 and 145 formed over hard bias layers 130 and 135, respectively, provide electrical connections for the flow of the sensing current $I_s$ from a current source 160 to the MR sensor 100. Sensing means (a detector) 170 connected to leads 140 and 145 senses (detects) the change in the resistance due to changes induced in the freelayer 110 by the external magnetic field (e.g., field generated by a data bit stored on a disk).

Another type of SV sensor is an antiparallel (AP) pinned SV sensor. In AP-pinned SV sensors, the pinned layer is a laminated structure of two ferromagnetic layers separated by a non-magnetic coupling layer such that the magnetizations of the two ferromagnetic layers are strongly coupled together antiferromagnetically in an antiparallel orientation. The AP-pinning method provides improved pinning for the ferromagnetic layer than is achieved with the pinned layer structure of the SV sensor of FIG. 1. This improved pinning increases the stability of the AP-Pinned SV sensor at high temperatures and enhances its performance in hard disk drives.

FIG. 2 shows a prior art AP-pinned SV sensor 200 comprising end regions 204 and 206 separated from each other by a central region 202. A freelayer 210 is separated from a laminated AP-pinned layer structure 220 by a nonmagnetic, electrically-conducting spacer layer 215. The magnetization of the laminated AP-pinned layer structure 220 is fixed by an antiferromagnetic (AFM) layer 230. The laminated AP-pinned layer structure 220 comprises a first ferromagnetic layer 222 and a second ferromagnetic layer 226 separated by an antiparallel coupling (APC) layer 224 of nonmagnetic material. The two ferromagnetic layers 222, 226 (PF1 and PF2) in the laminated AP-pinned layer structure 220 have their magnetization directions oriented antiparallel, as indicated by the arrows 223, 227 (arrows pointing into and out of the plane of the paper respectively). The AFM layer 230 is formed on a seed layer 240 deposited on the substrate 250. To complete the central region 202 of the SV sensor, a capping layer 205 is formed on the freelayer 210. Hard bias layers 252 and 254 formed in the end regions 204 and 206, respectively, provide longitudinal bias for the freelayer 210. Leads 260, 265 provide electrical connections for the flow of the sensing current $I_s$ from a current source 270 to the SV sensor 200. Sensing means 280 connected to leads 260, 265 senses the change in the resistance due to changes induced in the freelayer 210 by the external magnetic field (e.g., field generated by a data bit stored on a disk).

FIG. 3 is a more detailed depiction of a read head 300 having a spin valve (SV) sensor 302 of the AP-pinned type, which is described in U.S. Pat. No. 6,317,299 B1. This SV sensor 302 is generally formed over a first read gap layer 301. SV sensor 302 includes a nonmagnetic conductive spacer layer (S) 304 which is located between a freelayer structure 306 and an AP-pinned layer structure 352. Freelayer structure 306 includes freelayers (F) 314 and a nanolayer (NL) 316 with the nanolayer located between spacer layer 304 and freelayers 314 for increasing the magnetoresistive coefficient (dR/R) of SV sensor 302.

Freelayer structure 306 has a magnetic moment 318 which is directed parallel to the ABS from left to right as shown, or optionally from right to left. Magnetic moment 318 is rotated upwardly and downwardly by signal fields from the rotating magnetic disk. When the sense current ($I_s$) is conducted through SV sensor 302 a rotation of magnetic moment 318 upwardly increases the resistance of the sensor and a rotation of magnetic moment 318 downwardly decreases the resistance which are processed as playback signals. A cap layer 320 is located on freelayers 314 for protecting it from subsequent processing steps.

AP-pinned layer structure 302 also includes first and second AP pinned layers (AP1 and AP2) 354 and 356 with an AP coupling layer 358 located between first and second AP pinned layers 354 and 356. First and second AP pinned layers 356 and 358 have first and second magnetic moments 360 and 362 which are antiparallel with respect to one another. Because of this relationship, AP-pinned layer structure 352 produces a net demagnetizing field which is less than that using a conventional pinned layer. SV sensor 302 is also located on a seed layer structure 322 where pinning layer 310 interfaces with a first seed layer 324 thereof.

Conventional thicknesses and materials of the layers of SV sensor 302 are 250 Angstroms of platinum-manganese (PtMn) for pinning layer 310, 20 Angstroms of copper (Cu) for spacer layer 304, 15 Angstroms of cobalt-iron (CoFe) for nanolayer 316, 45 Angstroms of nickel-iron (NiFe) for freelayers 314, and 50 Angstroms of tantalum (Ta) for cap layer 320. Conventional thicknesses and materials for AP pinned layer structure are 23 Angstroms of cobalt-iron (CoFe) for first AP pinned layer 354, 26 Angstroms of cobalt-iron (CoFe) for second AP pinned layer 356, and 8 Angstroms of ruthenium (Ru) for AP coupling layer 358. Seed layer structure 322 for SV sensor 302 includes 10 Angstroms of cobalt-iron-boron (CoFeB) for first seed layer 324, 30 Angstroms of nickel-manganese-oxide (NiMnO) for a second seed layer 326 and 30 Angstroms of aluminum-oxide ($Al_2O_3$) for a third seed layer 328 with the second seed layer located between the first and third seed layers.

Thinner freelayer structures are becoming necessary due to increasing areal densities. It is important that such freelayer structures maintain soft magnetic properties to provide low coercivities. Nanolayer 316, which is made of cobalt-iron, is necessary in SV sensor 302 for increasing the magnetoresistive coefficient (dR/R). Unfortunately when the thickness of freelayer 314 is decreased, nanolayer 316 increases percentage-wise at the expense of nickel-iron, which is very soft magnetically compared to cobalt-iron. Therefore, these thin freelayers possess large coercivities and intrinsic anisotropy. Control over thickness also becomes difficult for very thin freelayer structures. The use of AP-pinned freelayers, however, helps alleviate the latter problem.

Accordingly, what is needed is an AP-pinned type SV sensor which has a very thin freelayer structure with soft magnetic properties and high GMR.

SUMMARY OF THE INVENTION

A spin valve (SV) sensor has a cap layer made of tantalum; a copper layer formed beneath the cap layer; and a unique freelayer structure. The freelayer structure includes a first layer made of nickel-iron, a second layer made of ruthenium, a third layer made of nickel-iron, a nanolayer made of cobalt-iron, and a spacer layer made of copper adjacent the nanolayer of cobalt-iron. The first layer of nickel-iron is no greater than each one of the third layer of nickel-iron and the nanolayer of cobalt-iron. The nanolayer has a thickness of no more than 30 Angstroms. The net freelayer thickness, determined based on subtracting a thickness of the first layer of nickel-iron from a sum of thicknesses of the third layer of nickel-iron and the nanolayer of cobalt-iron, is less than 50 Angstroms. Advantageously, this thin structure provides a high magnetoresistive coefficient and soft magnetic properties.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION OF THE PREFERRED EMBODIMENTS

The following description is the best embodiment presently contemplated for carrying out the present invention. This description is made for the purpose of illustrating the general principles of the present invention and is not meant to limit the inventive concepts claimed herein.

Figure 1:
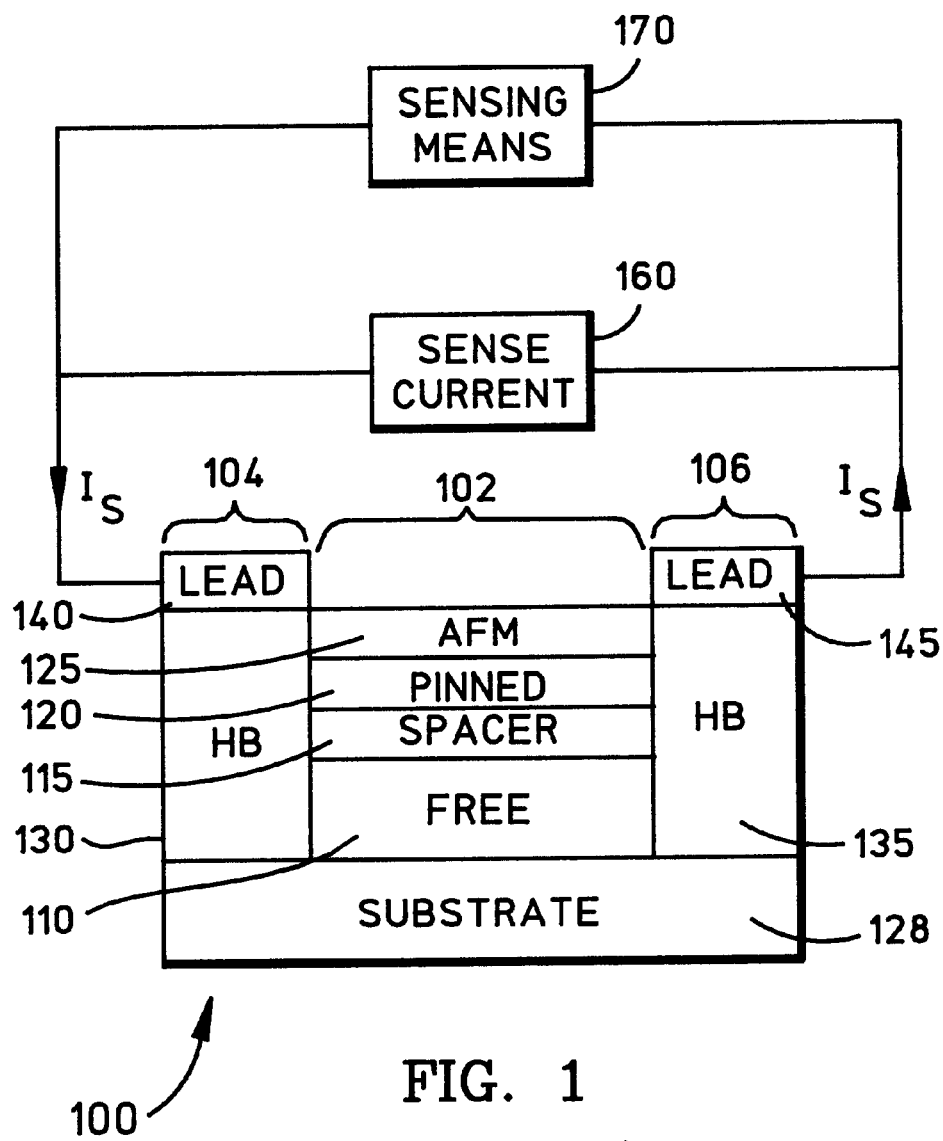
FIG. 1 is an air bearing surface (ABS) view, not to scale, of a prior art spin valve (SV) sensor.
Figure 2:
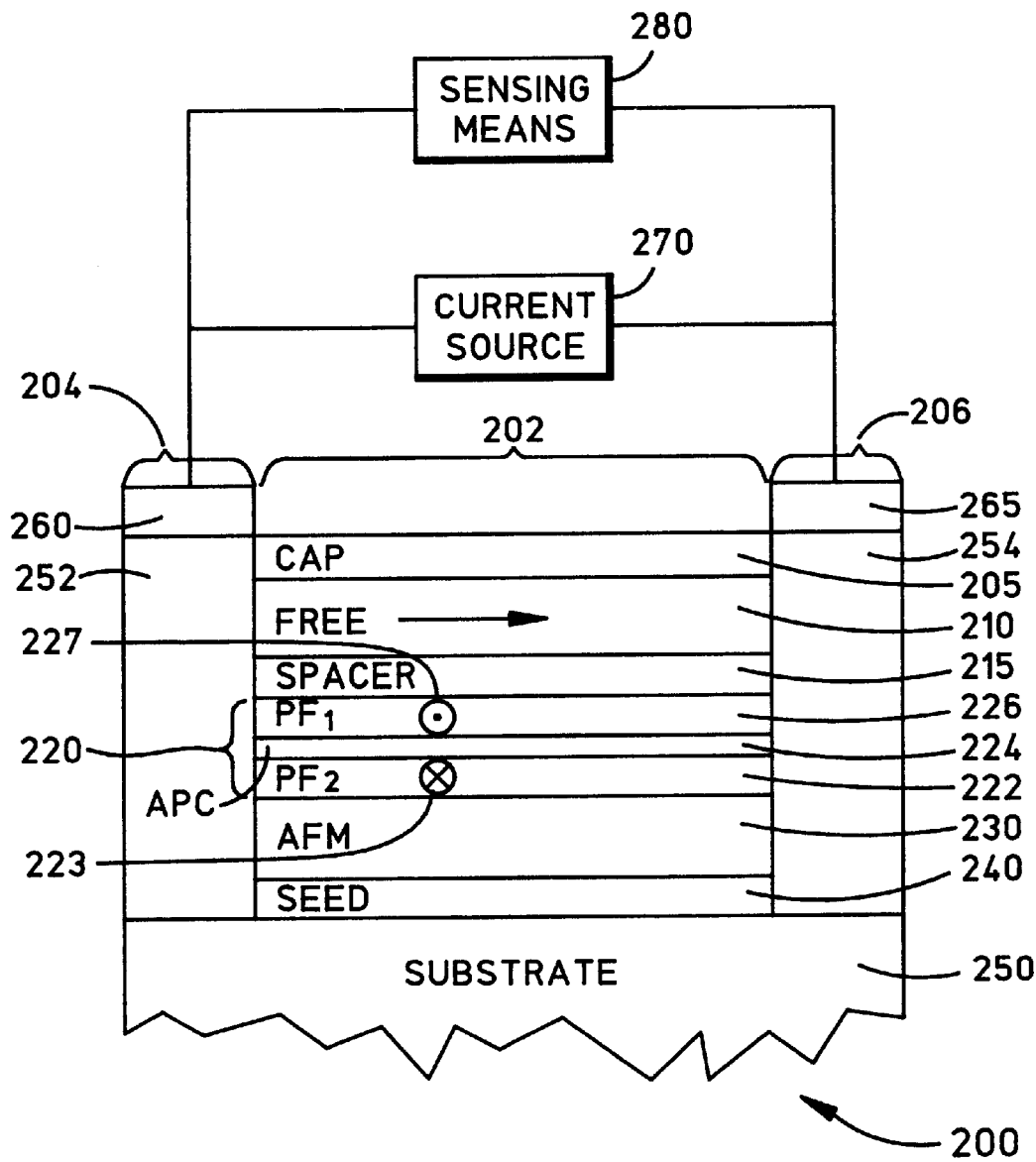
FIG. 2 is an ABS view, not to scale, of a prior art AP-pinned SV sensor.
Figure 3:
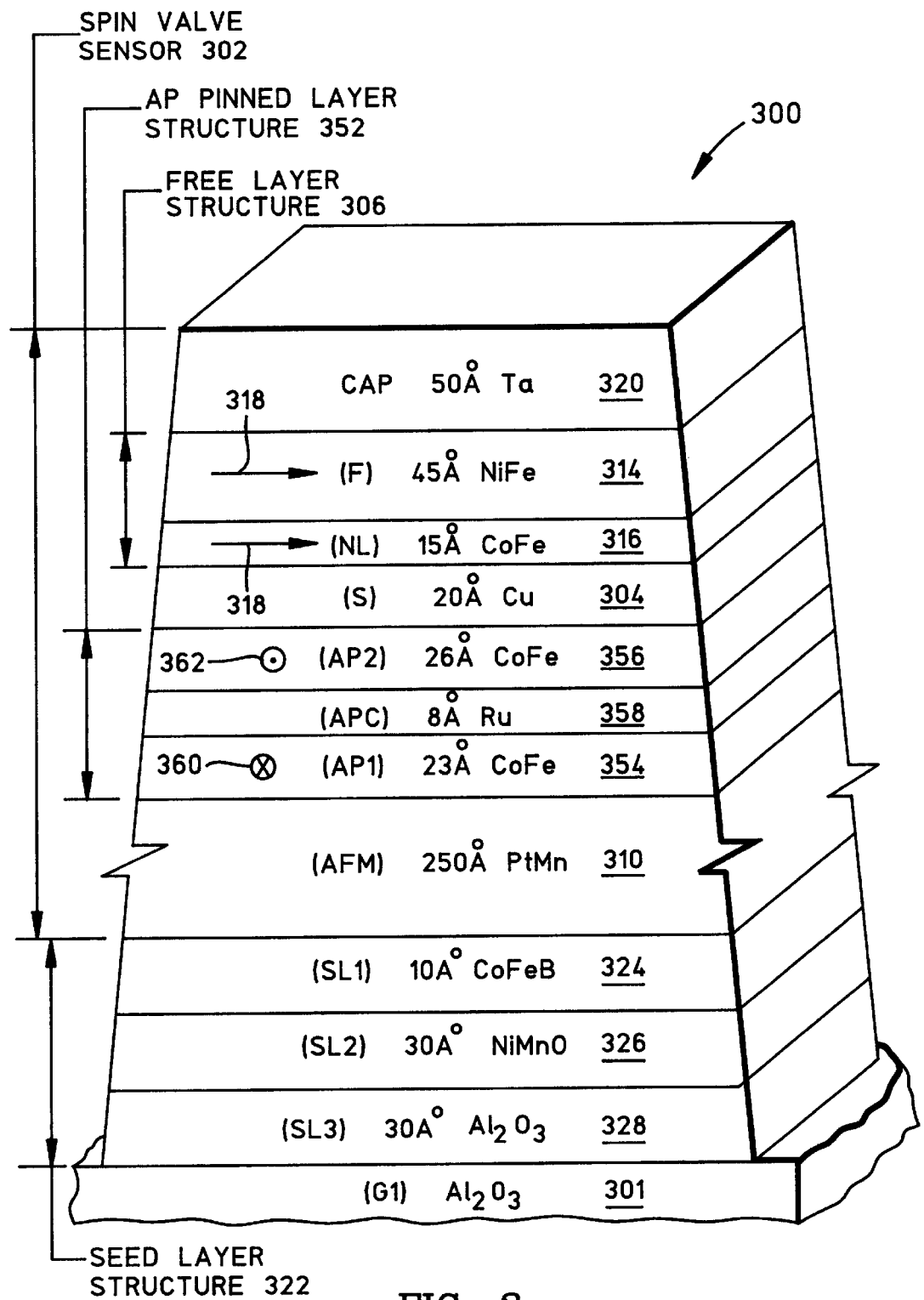
FIG. 3 is an ABS illustration of a prior art AP-pinned SV sensor with further detail.
Figure 4:
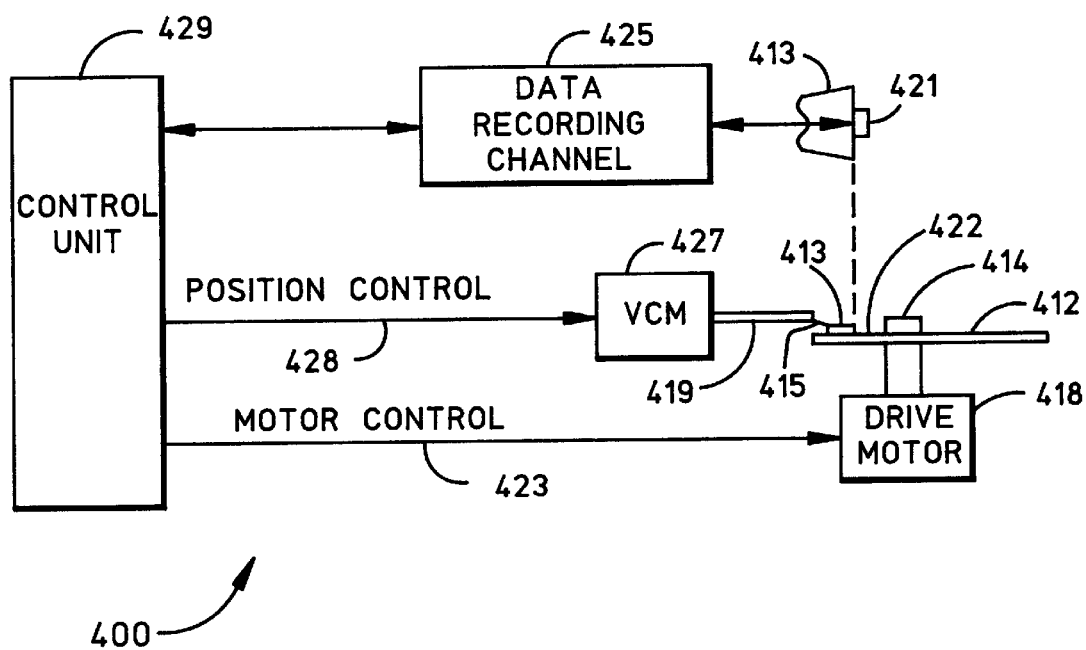
FIG. 4 is a simplified drawing of a magnetic recording disk drive system.

Referring now to FIG. 4, there is shown a disk drive 400 embodying the present invention. As shown in FIG. 4, at least one rotatable magnetic disk 412 is supported on a spindle 414 and rotated by a disk drive motor 418. The magnetic recording media on each disk is in the form of an annular pattern of concentric data tracks (not shown) on disk 412.

At least one slider 413 is positioned on the disk 412, each slider 413 supporting one or more magnetic read/write heads 421 where the head 421 incorporates the MR sensor of the present invention. As the disks rotate, slider 413 is moved radially in and out over disk surface 422 so that heads 421 may access different portions of the disk where desired data is recorded. Each slider 413 is attached to an actuator arm 419 by means of a suspension 415. The suspension 415 provides a slight spring force which biases slider 413 against the disk surface 422. Each actuator arm 419 is attached to an actuator means 427. The actuator means as shown in FIG. 4 may be a voice coil motor (VCM). The VCM comprises a coil movable within a fixed magnetic field, the direction and speed of the coil movements being controlled by the motor current signals supplied by controller 429.

During operation of the disk storage system, the rotation of disk 412 generates an air bearing between slider 413 (the surface of slider 413, which includes head 421 and an air bearing surface (ABS), faces the disk 412) and disk surface 422 which exerts an Was upward force or lift on the slider. The air bearing thus counter-balances the slight spring force of suspension 415 and supports slider 413 off and slightly above the disk surface by a small, substantially constant spacing during normal operation.

The various components of the disk storage system are controlled in operation by control signals generated by control unit 429, such as access control signals and internal clock signals. Typically, control unit 429 comprises logic control circuits, storage means and a microprocessor. The control unit 429 generates control signals to control various system operations such as drive motor control signals on line 423 and head position and seek control signals on line 428. The control signals on line 428 provide the desired current profiles to optimally move and position slider 413 to the desired data track on disk 412. Read and write signals are communicated to and from read/write heads 421 by means of recording channel 425.

The above description of a typical magnetic disk storage system, and the accompanying illustration of FIG. 4 are for representation purposes only. It should be apparent that disk storage systems may contain a large number of disks and actuators, and each actuator may support a number of sliders.

Figure 5:
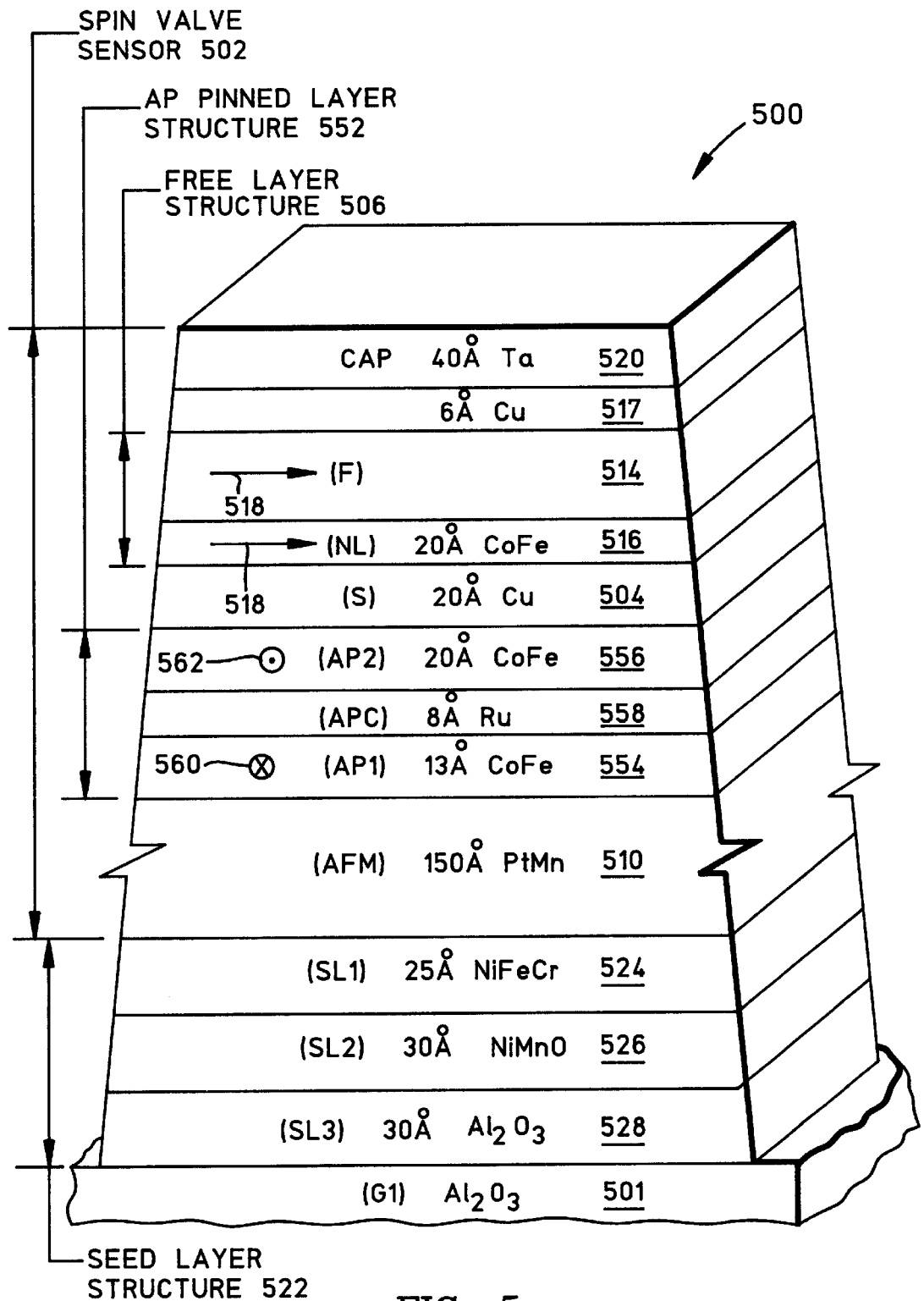
FIG. 5 is an ABS illustration of an AP-pinned SV sensor of the present embodiment.
Figure 6:
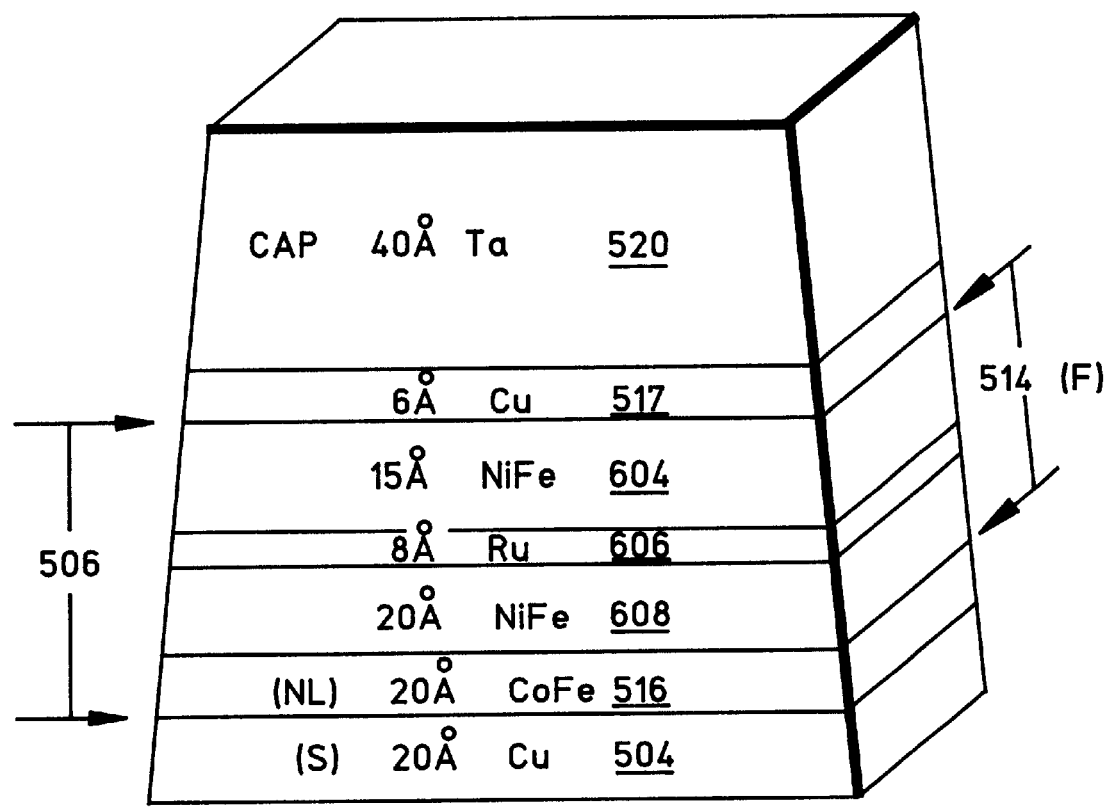
FIG. 6 is an ABS illustration of the freelayer structure of the AP-pinned SV sensor of FIG. 5.

FIGS. 5 and 6 are ABS illustrations of a spin valve (SV) 500 having an AP-pinned type SV sensor 502 of the present invention. SV sensor 502 is generally formed over a first read gap layer 501. SV sensor 502 includes a nonmagnetic conductive spacer layer (S) 504 which is located between a freelayer structure 506 and an AP-pinned layer structure 552. Freelayer structure 506 includes freelayers (F) 514 and a nanolayer (NL) 516, with the nanolayer located between spacer layer 504 and freelayers 514 for increasing the magnetoresistive coefficient (dR/R). Freelayers 514 are later described and shown in more detail in relation to FIG. 6.

Freelayer structure 506 shown in FIG. 5 has a magnetic moment 518 which is directed parallel to the ABS from left to right as shown, or optionally from right to left Magnetic moment 518 is rotated upwardly and downwardly by signal fields from the rotating magnetic disk. When the sense current ($I_s$) is conducted through SV sensor 502 a rotation of magnetic moment 518 upwardly increases the resistance of the sensor and a rotation of magnetic moment 518 downwardly decreases the resistance which are processed as playback signals. A cap layer 520 is located on freelayer 514 for protecting it from subsequent processing steps. A copper (Cu) layer 517 is positioned in between cap layer 520 and freelayer structure 506.

AP-pinned layer structure 552 includes first and second AP pinned layers (AP1 and AP2) 554 and 556 with an AP coupling layer 508 located between first and second AP pinned layers 554 and 556. First and second AP pinned layers 554 and 556 have first and second magnetic moments 560 and 562 which are antiparallel with respect to one another. Because of this relationship, AP-pinned layer structure 552 produces a net demagnetizing field which is less than that using a conventional pinned layer. SV sensor 502 is located on a seed layer structure 522 where pinning layer 510 interfaces with a first seed layer 524 thereof. Spin valve sensor 502 is referred to as a bottom spin valve sensor since pinning layer 510 is located at the bottom of the spin valve sensor closer to the first read gap layer 501 than freelayer structure 506 is to the first read gap layer.

Referring now to FIG. 6, the plurality of freelayers 514 which are included in SV sensor 502 of FIG. 5 are shown. A first layer 604 of nickel-iron (NiFe) is formed beneath copper layer 517 and over a second layer 606 of ruthenium (Ru), which is formed over a third layer 608 of nickel-iron (NiFe). Third layer 608 (NiFe) is formed over nanolayer 516 (CoFe).

Exemplary thicknesses of the layers of SV sensor 502 (FIG. 5) are 150 Angstroms of platinum-manganese (PtMn) for pinning layer 510, 20 Angstroms of copper (Cu) for spacer layer 504, 20 Angstroms of cobalt-iron (CoFe) for nanolayer 516, 6 Angstroms for copper layer 517, 43 Angstroms for freelayers 514, and 40 Angstroms of tantalum (Ta) for cap layer 520. Exemplary thicknesses for freelayers 514 (FIG. 6) include 15 Angstroms of nickel-iron (NiFe) for first layer 604, 8 Angstroms of ruthenium (Ru) for second layer 606, and 20 Angstroms of nickel-iron (NiFe) for third layer 608. Exemplary thicknesses and materials for AP pinned layer structure 552 (FIG. 5) are 13 Angstroms of cobalt-iron (CoFe) for first AP pinned layer 554, 20 Angstroms of cobalt-iron (CoFe) for second AP pinned layer 556, and 8 Angstroms of ruthenium (Ru) for AP coupling layer 558. Seed layer structure 522 for SV sensor 502 includes 25 Angstroms of nickel-iron-chromium (NiFeCr) for first seed layer 524, 30 Angstroms of nickel-manganese-oxide (NiMnO) for a second seed layer 526, and 30 Angstroms of aluminum-oxide ($Al_2O_3$) for a third seed layer 528 with the second seed layer located between the first and third seed layers.

The percentage composition of the various elements of the materials are $Ni_{50}Fe_{12}Cr_{38}$, $Ni_{50}Mn_{50}O$, $Pt_{50}Mn_{50}$, $Co_{90}Fe_{10}$, and $Ni_{83}Fe_{17}$. All of the layers were deposited in situ except for the first gap layer 501 ("in situ" deposition refers to a process where all layers are deposited in an ion-beam sputtering chamber without breaking the vacuum).

The net freelayer moment, which is determined by subtracting the thickness of the NiFe 604 from the sum of the thicknesses of the NiFe 608 and the CoFe 516, can be adjusted accordingly by varying the thicknesses of these materials. Preferably, the net freelayer moment/thickness is less than 50 Angstroms and the nanolayer is no more than 30 Angstroms. Upon testing the particular embodiment of FIGS. 5 and 6, which has a net freelayer moment of 25 Angstroms (20A of NiFe 608+20A of CoFe 516−15A of NiFe 604), the magnetoresistive coefficient (dR/R) of spin valve sensor 502 was measured at 8.66% and the coercivity Hc was 5.4 Oe. Both of these values are considered to be excellent in the SV sensor art By contrast, testing a similar embodiment which had the NiFe 516 and the NiFe 604 replaced with CoFe showed measurements of dR/R at 4.9% and coercivity Hc of 14.5 Oe. These latter values are considered unacceptable. This unworkable variation illustrates the importance in the materials selected for freelayer structure 506.

Thus, an antiparallel (AP) pinned type spin valve (SV) sensor having ultra-thin freelayers includes a cap layer made of tantalum (Ta); a copper (Cu) layer formed beneath the cap layer; a freelayer structure which includes a first layer made of nickel-iron (NiFe), a second layer made of ruthenium (Ru), a third layer made of nickel-iron (NiFe), and a nanolayer made of cobalt-iron (CoFe); and a spacer layer made of copper (Cu). This thin structure provides an optimal combination of CoFe and NiFe for a high magnetoresistive coefficient (dR/R) and soft magnetic properties. The net freelayer thickness can be adjusted by varying the thicknesses of the NiFe layers and the CoFe nanolayer.

It is to be understood that the above is merely a description of preferred embodiments of the invention and that various changes, alterations, and variations may be made without departing from the true spirit and scope of the invention as set for in the appended claims. It should be understood that the thicknesses for the various layers are exemplary and can be varied. Further, while cobalt iron (CoFe) is preferred for the pinned and nanolayers, cobalt (Co) could be substituted therefor. Still further, while platinum manganese (PtMn) is preferred for the pinning layers, other metallic antiferromagnetic materials may be employed such as iridium manganese (IrMn), nickel manganese (NiMn), iron manganese (FeMn), and palladium platinum manganese (PdPtMn). None of the terms or phrases in the specification and claims has been given any special particular meaning different from the plain language meaning to those skilled in the art, and therefore the specification is not to be used to define terms in an unduly narrow sense.

What is claimed is:

1. A spin valve (SV) sensor, comprising:
   a cap layer made of tantalum (Ta);
   a copper (Cu) layer formed beneath the cap layer;
   a freelayer structure which includes:
      a first layer made of nickel-iron (NiFe);
      a second layer made of ruthenium (Ru);
      a third layer made of nickel-iron (NiFe);
      the second layer of Ru formed between the first and third layers of NiFe;
      a nanolayer made of cobalt-iron (CoFe);
   a spacer layer made of copper (Cu) adjacent the nanolayer of CoFe;
   wherein the first layer of NiFe is no greater than each one of the third layer of NiFe and the nanolayer of CoFe;
   wherein the nanolayer has a thickness that is no more than 30 Angstroms; and
   wherein a net freelayer thickness of the SV sensor, determined based on subtracting a thickness of the first layer of NiFe from a sum of thicknesses of the third layer of NiFe and the nanolayer of CoFe, is less than 50 Angstroms.

2. The SV sensor of claim 1, wherein the first and the third layers of NiFe comprise $Ni_{83}Fe_{17}$.

3. The SV sensor of claim 1, wherein the nanolayer of CoFe comprises $Co_{90}Fe_{10}$.

4. The SV sensor of claim 1, wherein the freelayer structure provides for an increased magnetoresistive coefficient and decreased coercivity.

5. The SV sensor of claim 1, further comprising:
   a first antiparallel (AP) pinned layer;
   a second AP-pinned layer;
   an antiparallel coupling (APC) layer disposed between the first and the second AP-pinned layers; and
   a seed layer formed beneath the first and the second AP-pinned layers which includes a nickel-iron (NiFe) alloy.

6. A magnetic head, comprising:
   a spin valve (SV) sensor which includes:
      a cap layer made of tantalum (Ta);
      a copper (Cu) layer formed beneath the cap layer;
      a plurality of freelayers which include a first layer consisting of nickel-iron ($Ni_{83}Fe_{17}$), a second layer made of ruthenium (Ru), and a third layer consisting of nickel-iron ($Ni_{83}Fe_{17}$);
      the second layer of Ru formed between the first and third layers of $Ni_{83}Fe_{17}$;
      a nanolayer consisting of cobalt-iron ($Co_{90}Fe_{10}$); and
      a spacer layer made of copper (Cu) which is adjacent the nanolayer of $Co_{90}Fe_{10}$,
      wherein the first layer of $Ni_{83}Fe_{17}$ is no greater than each one of the third layer of $Ni_{83}Fe_{17}$ and the nanolayer of $Co_{90}Fe_{10}$;
      wherein the nanolayer has a thickness that is no more than 30 Angstroms; and
      wherein a net freelayer thickness of the SV, determined by subtracting a thickness of the first layer of $Ni_{83}Fe_{17}$ from a sum of thicknesses of the third layer of $Ni_{83}Fe_{17}$ and the nanolayer of $Co_{90}Fe_{10}$, is less than 50 Angstroms.

7. The magnetic head of claim 6, further comprising:
   a first antiparallel (AP)-pinned layer;
   a second AP-pinned layer; and
   an antiparallel coupling (APC) layer disposed between the first and the second AP-pinned layers.

8. A disk drive, comprising:
   a magnetic head with a spin valve (SV) sensor which includes:
      a cap layer made of tantalum (Ta);
      a copper (Cu) layer formed beneath the cap layer;
      a plurality of freelayers which include a first layer made of nickel-iron (NiFe), a second layer made of ruthenium (Ru), and a third layer made of nickel-iron (NiFe);
      the second layer of Ru formed between the first and third layers of NiFe;
      a nanolayer made of cobalt-iron (CoFe);
      a spacer layer made of copper (Cu);
      wherein the first layer of NiFe is no greater than each one of the third layer of NiFe and the nanolayer of CoFe;
      wherein the nanolayer has a thickness that is no more than 30 Angstroms; and
      wherein a net freelayer thickness of the SV sensor, determined based on subtracting a thickness of the first layer of NiFe from a sum of thicknesses of the third layer of NiFe and the nanolayer of CoFe, is less than 50 Angstroms.

9. The disk drive of claim 8, wherein the first and the third layers of NiFe comprise $Ni_{83}Fe_{17}$.

10. The disk drive of claim 8, wherein the nanolayer of CoFe comprises $Co_{90}Fe_{10}$.

11. The disk drive of claim 8, wherein the freelayers and nanolayer provide for an increased magnetoresistive coefficient and decreased coercivity in the SV sensor.

12. The disk drive of claim 8, wherein the first and the third layers of NiFe consist of NiFe.

13. The disk drive of claim 8, further comprising:
   a first antiparallel (AP)-pinned layer;
   a second AP-pinned layer;
   an antiparallel coupling (APC) layer disposed between the first and the second AP-pinned layers; and
   a seed layer formed beneath the first and the second AP-pinned layers which includes a nickel-iron (NiFe) alloy.

* * * * *